(12) United States Patent
Wong

(10) Patent No.: US 9,820,389 B2
(45) Date of Patent: *Nov. 14, 2017

(54) PARTIALLY DEPOPULATED INTERCONNECTION ARRAYS FOR PACKAGED SEMICONDUCTOR DEVICES AND PRINTED CIRCUIT BOARDS

(71) Applicant: Lattice Semiconductor Corporation, Portland, OR (US)

(72) Inventor: Ban Pak Wong, Milpitas, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 34 days.

This patent is subject to a terminal disclaimer.

(21) Appl. No.: 15/140,779

(22) Filed: Apr. 28, 2016

(65) Prior Publication Data

US 2016/0242298 A1 Aug. 18, 2016

Related U.S. Application Data

(63) Continuation of application No. 14/070,975, filed on Nov. 4, 2013, now Pat. No. 9,345,137.

(51) Int. Cl.

| H01R 9/00 | (2006.01) |
|---|---|
| H05K 3/34 | (2006.01) |
| H05K 1/11 | (2006.01) |
| H01L 23/498 | (2006.01) |
| H01L 23/50 | (2006.01) |
| G06F 17/50 | (2006.01) |

(52) U.S. Cl.
CPC ....... *H05K 3/3436* (2013.01); *G06F 17/5077* (2013.01); *H01L 23/49816* (2013.01); *H01L 23/49838* (2013.01); *H01L 23/50* (2013.01); *H05K 1/111* (2013.01); *H05K 1/112* (2013.01); *H01L 2924/0002* (2013.01); *H05K 2201/09227* (2013.01); *H05K 2201/10734* (2013.01); *Y02P 70/613* (2015.11)

(58) Field of Classification Search
USPC ................................. 361/772, 775, 778, 803
See application file for complete search history.

(56) References Cited

U.S. PATENT DOCUMENTS

| 2007/0057362 A1* | 3/2007 | Brown ................ G06F 17/5068 257/697 |
|---|---|---|
| 2010/0006992 A1* | 1/2010 | Dirks .................. H01L 23/3107 257/676 |

* cited by examiner

*Primary Examiner* — Andargie M Aychillhum

(57) ABSTRACT

In one embodiment, a ball grid array (BGA) of a packaged semiconductor device and a corresponding landing pad array of a printed circuit board each have a layout defined by an interconnection array having (i) an inner sub-array of locations having connectors arranged in rows and columns separated by a specified pitch and (ii) an outer rectangular ring of locations having connectors arranged in rows and columns separated by the specified pitch. The outer rectangular ring is separated from the inner sub-array by a depopulated rectangular ring having a width of at least twice the specified pitch, wherein the depopulated rectangular ring has no connectors. The outer rectangular ring has empty locations having no connectors. Some of those empty locations define depopulated sets that divide the outer rectangular ring into a number of different contiguous sets of locations having connectors that enable pin escape for connectors of the device's BGA.

17 Claims, 3 Drawing Sheets

100

300

PARTIALLY DEPOPULATED INTERCONNECTION ARRAYS FOR PACKAGED SEMICONDUCTOR DEVICES AND PRINTED CIRCUIT BOARDS

This application is a continuation of patent application Ser. No. 14/070,975, filed on Nov. 4, 2013, which is incorporated by reference herein in its entirety.

BACKGROUND

Field

The present disclosure relates to packaged semiconductor devices and printed circuit boards and, more specifically but not exclusively, to the interconnection arrays (e.g., ball grid arrays and their corresponding landing pad arrays) used to mate packaged semiconductor devices to printed circuit boards.

Description of the Related Art

This section introduces aspects that may help facilitate a better understanding of the disclosure. Accordingly, the statements of this section are to be read in this light and are not to be understood as admissions about what is prior art or what is not prior art.

Some conventional packaged semiconductor devices have a ball grid array (BGA), which comprises solder balls arranged in the rows and columns of a two-dimensional, rectangular grid. These packaged devices are designed to mount onto a printed circuit board (PCB) having a landing pad array, which comprises landing pads arranged in the rows and columns of a corresponding two-dimensional, rectangular grid, such that each BGA solder ball of the packaged device mates with a corresponding landing pad in the PCB landing pad array.

Some of the BGA solder balls are power solder balls that provide power supply voltages (including ground) to the semiconductor die of the packaged device, while other BGA solder balls are signal solder balls that transmit signals to and/or from the semiconductor die. These power solder balls and signal solder balls are configured to mate with corresponding power landing pads and signal landing pads, respectively, in the PCB landing pad array.

Conventional printed circuit boards have different layers that function as either signal routing layers or power planes. In plated through-hole technology, each landing pad on the PCB top layer has a metalized via extending from that PCB top layer all the way down to the PCB bottom layer, where the via provides an electrical connection from the landing pad to only one of those PCB layers. The other PCB layers through which the via passes have anti-pads, which are regions devoid of metal to prevent electrical interconnection between the via and those layers. The PCB layer to which the via is electrically connected has one or more metal features (e.g., signal traces or power planes) that provide a conducting path to electrically connect the landing pad to other devices mounted on the PCB or to components external to the PCB.

Each power landing pad has a corresponding via that electrically connects the power landing pad to a PCB layer that functions as a power plane. A given ball grid array and its corresponding landing pad array may have a number of different solder balls and landing pads designed to carry the same power supply voltage level. All landing pads that are associated with the same power supply voltage level are typically connected to the same corresponding power plane.

On the other hand, each signal landing pad has a corresponding via that electrically connects the signal landing pad to a PCB layer that functions as a signal routing layer. Typically, each signal landing pad carries a unique signal that is different from every other signal carried by every other signal landing pad. As such, the PCB signal routing layer that is connected to a signal landing pad must have a unique conducting path (e.g., trace) for the distinct signal associated with that signal landing pad. Each PCB signal routing layer typically has conducting paths or traces for many different signal landing pads. Depending on the particular design, a printed circuit board may have multiple signal routing layers in order to accommodate all of the different, unique signals. In order to keep the number of signal routing layers in the PCB as small as possible (to keep costs down), it is desirable to route as many different signals within each signal routing layer as possible.

Within each PCB signal routing layer, each via constitutes a physical obstruction that can inhibit the ability to route conducting paths for those signals connected to that PCB layer. As packaged devices get smaller and in order to conserve layout area on printed circuit boards, it is desirable to reduce the pitch of the ball grid arrays and corresponding landing pad arrays, where the pitch refers to the distance between the centers of adjacent solder balls or adjacent landing pads. Unfortunately, as the pitch gets smaller, it typically takes more PCB signal routing layers to route signals to and from the different signal landing pads, because there is simply less room between obstructing vias to route those signals.

BRIEF DESCRIPTION OF THE DRAWINGS

Embodiments of the present invention are illustrated by way of example and are not limited by the accompanying figures, in which like references indicate similar or identical elements. Elements in the figures are illustrated for simplicity and clarity and have not necessarily been drawn to scale.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components.

As used herein, the term "interconnection array" generically refers to both ball grid arrays on packaged semiconductor devices and their corresponding landing pad arrays on printed circuit boards. In addition, the term "connectors" is used generically to refer to both the solder balls of a ball grid array and to the landing pads of a corresponding landing pad array.

Figure 1:
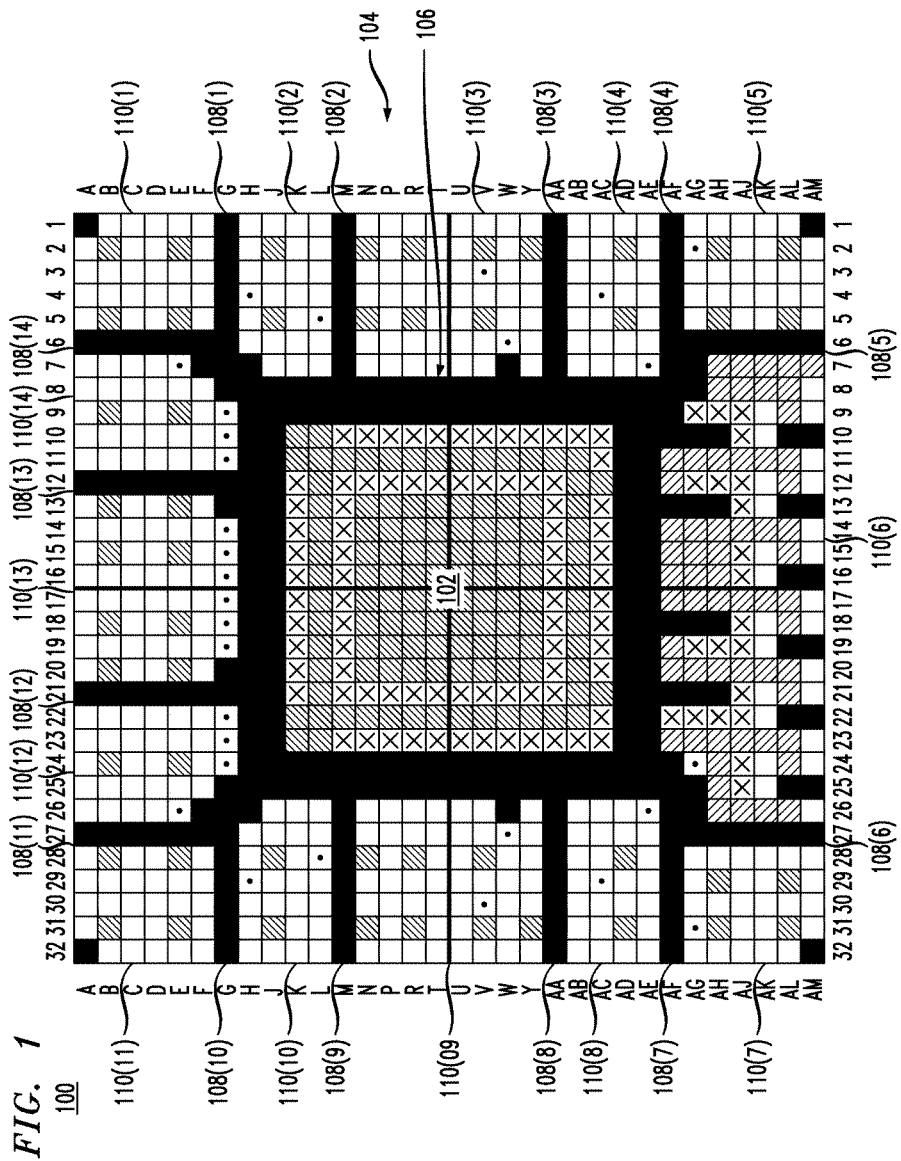
FIG. 1 shows the layout of an exemplary partially depopulated interconnection array.

FIG. 1 shows the layout of an exemplary partially depopulated interconnection array 100 that can be used as the layout for a landing pad array of a printed circuit board and for the corresponding ball grid array of a packaged semiconductor device designed to be mounted onto and mated with that PCB landing pad array. Interconnection array 100 corresponds to a grid consisting of 1024 locations arranged in 32 columns and 32 rows. Significantly, however, interconnection array 100 is a partially depopulated interconnection array that has 268 empty locations that do not have connectors and only 756 locations with connectors.

As shown in FIG. 1, partially depopulated interconnection array 100 has a (14×14) fully populated, inner sub-array 102 of connectors and a partially depopulated outer rectangular ring 104 of connectors seven locations wide, where the inner sub-array and the outer rectangular array are separated by a two-location-wide fully depopulated rectangular ring 106.

Furthermore, the partially depopulated outer rectangular ring 104 has 14 sets 108(1)-108(14) of empty locations that span from the fully depopulated rectangular ring 106 to the outer edge of interconnection array 100. Note that some of these so-called depopulated sets of locations share certain locations. For example, depopulated sets 108(10) and 108(11) may be said to share some or all of empty locations (26,F), (27,F), (25,G), (26,G), (27,G), and (26,H). The 14 depopulated sets 108(1)-108(14) of locations divide the outer rectangular ring 104 into 14 different contiguous sets 110(1)-110(14) of locations that do have connectors. Each set 110 is called "contiguous" because the corresponding locations with connectors define a single, contiguous region that is not contiguous with any other contiguous set in the outer rectangular ring 104.

In addition to the empty locations of the depopulated rectangular ring 106 and the empty locations of the 14 depopulated sets 108(1)-108(14), interconnection array 100 also has a number of other empty locations, such as locations (1,A), (7,W), (10,AL), and (10,AM). These other empty locations partially depopulate some, but not all of regions corresponding to the contiguous sets 110(1)-110(14). For example, the region corresponding to contiguous set 110(1) may be said to be partially depopulated due to empty location (1,A), while the region corresponding to contiguous set 110(4) may be said to be fully populated because it consists of a (7×4) array of locations all having connectors.

In the exemplary layout of interconnection array 100 shown in FIG. 1:
  A black square represents an empty location;
  A square with a lower-left-to-upper-right solid diagonal pattern represents a location that carries the power supply ground reference level GND;
  A square with a upper-left-to-lower-right dashed diagonal pattern represents a location that carries a second ground reference level GNDA;
  A square with an "X" represents a power supply voltage level (note that there are number of different power supply voltage levels, most, if not all, of which have multiple locations);
  A square with a dot "•" represents a location having a ball in the BGA and a landing pad in the PCB landing pad array, but no corresponding PCB via. As such, these locations do obstruct routes in the PCB top routing layer, but not in any of the PCB lower routing layers. These locations offer flexibility for use in routing signals in other implementations using the same interconnection array layout; and
  Each white square represents a different, unique signal. Thus, in FIG. 1, all of the black squares are empty locations, all of the white squares correspond to signal connectors (i.e., signal solder balls or signal landing pads), and all of the other squares correspond to power connectors (i.e., power solder balls or power landing pads).

When interconnection array 100 represents the layout of a PCB landing pad array, (i) each location having a connector (i.e., a landing pad) has a via that spans from the top PCB layer (containing the landing pads) down to the bottom PCB layer and (ii) each empty location that does not have a landing pad has no corresponding via. As a result, there is no via in that corresponding location in every other PCB layer and therefore no corresponding obstruction to routing conducting paths for signals in the PCB's signal routing layers. As explained further below, by carefully selecting where to place the empty locations, the number of signal routing layers needed to route all of the different, unique signals can be reduced, thereby advantageously reducing the number of layers in the PCB.

Of course, interconnection array 100 also represents the layout of the ball grid array of the packaged semiconductor device that will mate to the corresponding PCB landing pad array having the same layout. In one possible implementation, the (14×14) inner sub-array 102 of connectors (i.e., solder balls) in interconnection array 100 corresponds to the size and location of the semiconductor die contained in the packaged device for which interconnection array 100 represents the layout of the ball grid array.

In this implementation, each location in the inner sub-array 102 of the ball grid array corresponds to a power solder ball that carries a power supply voltage to the semiconductor die. As such, each corresponding location in the inner sub-array 102 of the PCB landing pad array has a power landing pad with a power via connected to one of the PCB's power planes. In this way, the inner sub-array 102 of power solder balls together with the corresponding inner sub-array 102 of power landing pads and power vias function as a heat sink to assist in the conduction of heat away from the packaged semiconductor die. By fully populating inner sub-array 102 with power connectors, this heat sink functionality is optimized.

Furthermore, since power supply voltages do not have to be routed within PCB signal routing layers, making all of the connectors in the inner sub-array 102 power connectors does not obstruct any signal traces within those signal routing layers, even though the inner sub-array in each of the PCB's signal routing layers is fully populated with power vias. Note that this assumes that signal traces for signal landing pads in the outer rectangular ring 104 are always routed away from the center of a signal routing layer. Since all of the landing pads in inner sub-array 102 are power landing pads, the only signals that need to get routed in PCB signal routing layers are in outer rectangular ring 104, which, in this implementation, has a width of seven landing pads.

Note that some of the landing pads in the outer rectangular ring 104 are also power landing pads (e.g., ground landing pads) that do not require any routing within any PCB signal routing layers. This further reduces the number of signals that do need to be routed within the PCB's signal routing layers.

The separation resulting from the presence of the depopulated rectangular ring 106 provides area for dropping vias to enable package routing from wire-bond fingers (not shown)

on the top layer of the packaged semiconductor device to the BGA balls on the bottom layer of the packaged device.

Figure 2:
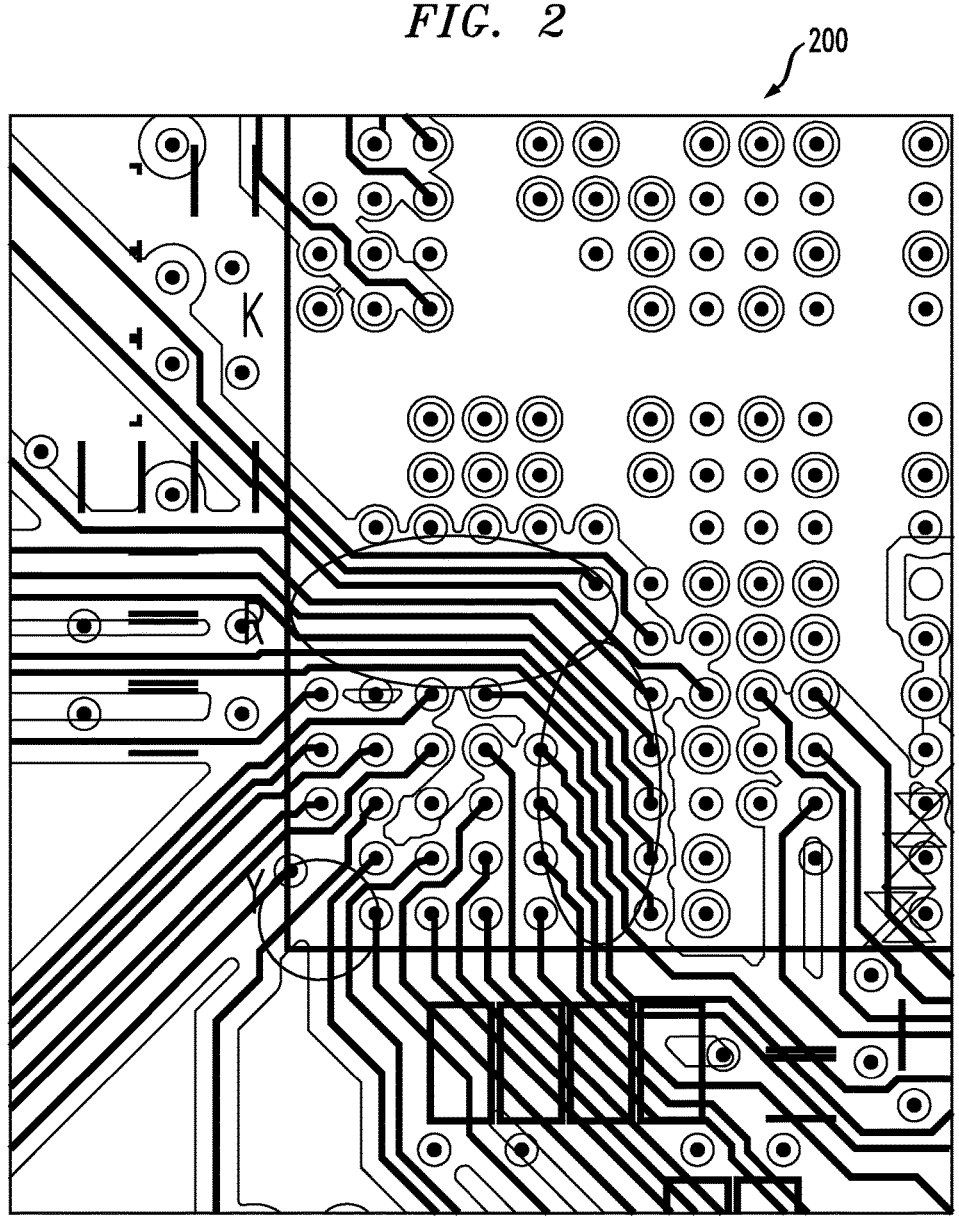
FIG. 2 shows top plan view of a corner of an exemplary PCB layer that functions as a signal routing layer.

FIG. 2 shows top plan view of a corner of an exemplary PCB layer 200 that functions as a signal routing layer within which a number of different signals are routed, taking advantage of the absence of obstructing vias corresponding to empty locations in a partially depopulated landing pad array. Note that the exemplary landing pad array of FIG. 2 has a different layout from that of FIG. 1. In FIG. 2, each circle represents a via passing through the signal routing layer 200. Each circle having a trace (i.e., conducting path) connected to it represents a via who signal is electrically connected to and routed within signal routing layer 200 along that trace. As shown in FIG. 2, the ovals identify groups of traces that are routed within the unobstructed regions in the signal routing layer corresponding to empty locations in the landing pad array. In exemplary PCB signal routing layer 200, signals from up to seven different columns and/or rows of signal pads in the landing pad array are able to be routed in a single signal routing layer.

Another advantage of the improved routing opportunities is the ability to route two or more related signals along relatively close and relatively straight traces compared to the prior art, which often required related signals to be routed along relatively distant and/or relatively crooked traces. Examples of related signals are the positive and negative components of a differential signal of a high-speed serial I/O (input/output) signal in a SerDes (serializer/deserializer) application, as well as the multiple, parallel signals corresponding to a DQS (data strobe) group of DDR (double data rate) signals. The partial depopulation in the SerDes signal ball out enables ease of pin escaping of the SerDes channels without having to meander around obstructions due to a fully populated array of signals in the SerDes ball out of the prior art. By routing such groups of signals along relatively close, relatively straight traces, and in the same layer, such signals will incur less inter-signal skew.

Figure 3:
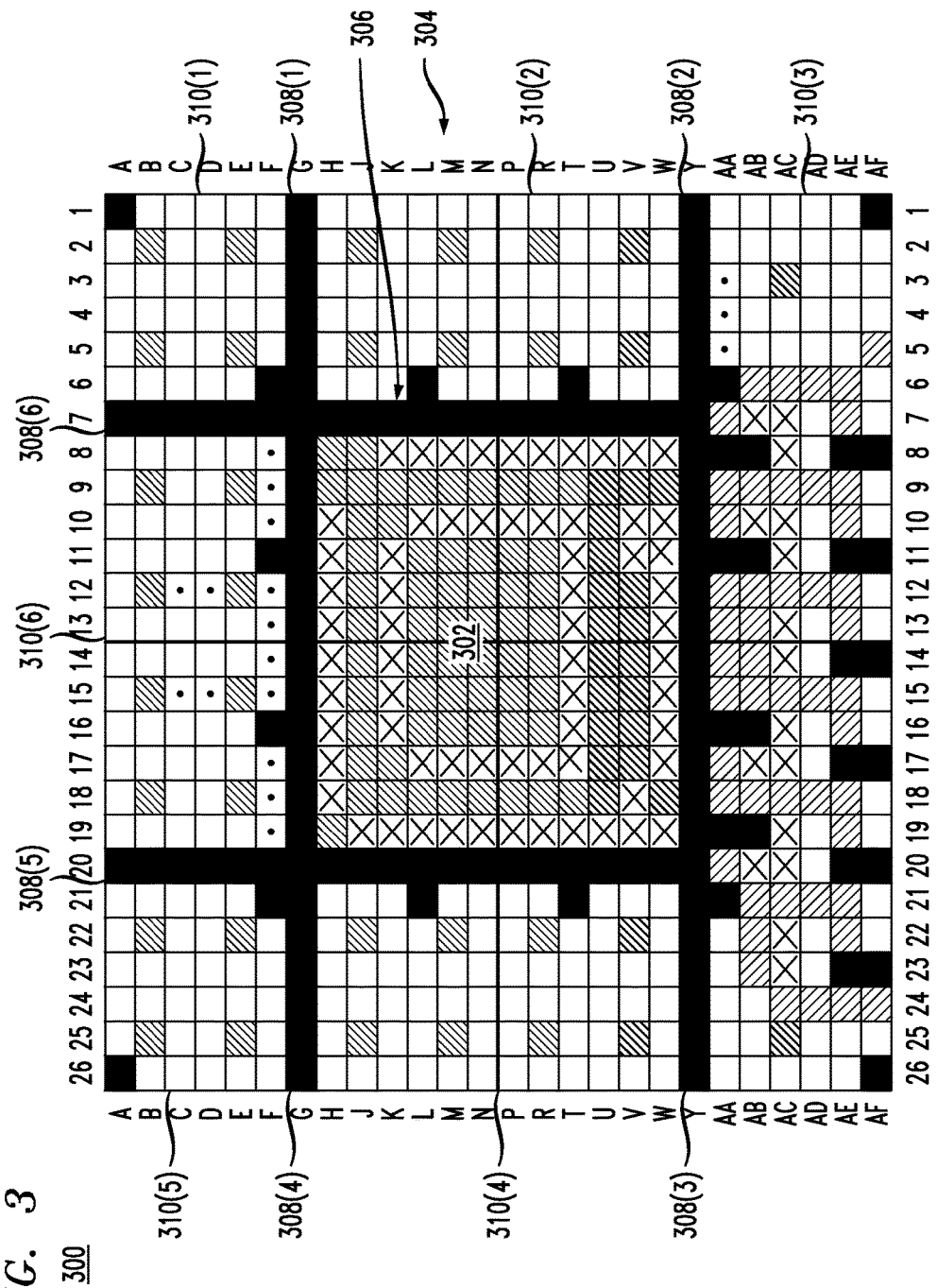
FIG. 3 shows the layout of another exemplary partially depopulated interconnection array.

FIG. 3 shows the layout of another exemplary partially depopulated interconnection array 300 that can be used as the layout for a landing pad array of a printed circuit board and for the corresponding ball grid array of a packaged semiconductor device designed to be mounted onto and mated with that PCB landing pad array. Interconnection array 300 corresponds to a grid consisting of 676 locations arranged in 26 columns and 26 rows. Like interconnection array 100 of FIG. 1, interconnection array 300 is a partially depopulated interconnection array that, in this case, has 122 empty locations and only 554 locations with connectors. Unlike interconnection array 100, in interconnection array 300, the inner sub-array 302 is only a (12×12) array of power locations, the outer rectangular ring 304 is only six locations wide, and the fully depopulated rectangular ring 306 is only one location wide. Furthermore, interconnection array 300 has only six depopulated sets 308(1)-308(6) of locations that divide the outer rectangular ring 304 into six contiguous sets 310(1)-310(6) of locations. The symbols used in FIG. 3 are the same as those used in FIG. 1.

In general, interconnection arrays of the present disclosure may:
  Be of any number of rows (greater than three) and any, possibly different, number of columns (greater than three);
  Have an inner sub-array of any number of rows and any, possibly different, number of columns, where the inner sub-array is either fully populated or partially depopulated with either all power connectors or a mixture of power and signal connectors;
  Have an outer rectangular ring having a width of at least one connector, where the outer rectangular ring is either fully populated or partially depopulated with either all signal connectors or a mixture of power and signal connectors;
  Have one or more depopulated sets of locations dividing the outer rectangular ring into one or more contiguous sets of connectors; and
  Have a fully depopulated rectangular ring separating the inner sub-array and the outer rectangular ring that is at least one location wide.

Although the invention has been described using relative terms such as "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non enabled embodiments and embodiments that correspond to non statutory subject matter are explicitly disclaimed even if they fall within the scope of the claims.

What is claimed is:

1. An article of manufacture comprising: a first interconnection array configured to mate with a corresponding second interconnection array, the first interconnection array comprising: an inner sub-array of locations having connectors arranged in rows and columns separated by a specified pitch; an outer rectangular ring of locations encircling the inner sub-array of locations and having connectors arranged in rows and columns separated by the specified pitch, wherein: the outer rectangular ring is separated from the inner sub-array by a depopulated rectangular ring encircling the inner sub-array and having a width of at least the specified pitch, wherein the depopulated rectangular ring has no connectors; the outer rectangular ring has a plurality of empty locations, defined according to the specified pitch, which have no connectors; and the plurality of empty locations includes at least one set of depopulated locations having no connectors that extends from the depopulated rectangular ring to an outer edge of the interconnection array, wherein two or more depopulated sets of locations extend from the depopulated rectangular ring to the outer edge of the interconnection array, thereby dividing the outer rectangular ring into a plurality of distinct contiguous sets of connectors.

2. The article of claim 1, wherein:
the first interconnection array is a ball grid array of a packaged semiconductor device;
and the second interconnection array is a landing pad array of a printed circuit board.

3. The article of claim 2, wherein the article comprises the packaged semiconductor device.

4. The article of claim 3, wherein the article further comprises the printed circuit board mated with the packaged semiconductor device.

5. The article of claim 1, wherein:
the first interconnection array is a landing pad array of a printed circuit board; and
the second interconnection array is a ball grid array of a packaged semiconductor device.

6. The article of claim 5, wherein the article comprises the printed circuit board.

7. The article of claim 5, wherein:
the printed circuit board comprises a plurality of layers; and
each landing pad in the landing pad array is connected to a corresponding via that extends to all of the layers in the printed circuit board.

8. The article of claim 7, wherein two or more SerDes channels and two or more DQS groups of signals are routed in a single layer of the printed circuit board.

9. The article of claim 7, wherein:
the inner sub-array of locations is fully populated; and
each landing pad in the fully populated, inner sub-array of locations and the corresponding via in the printed circuit board function as a heat sink for a corresponding ball in the ball grid array.

10. The article of claim 1, wherein the depopulated rectangular ring has a width of at least twice the specified pitch.

11. The article of claim 1, wherein the inner sub-array has no empty locations.

12. The article of claim 1, wherein:
each connector of the inner sub-array is a power connector configured to carry a power supply voltage; and
the outer rectangular ring comprises:
one or more signal connectors, each configured to carry a signal; and
one or more power connectors, each configured to carry a power supply voltage.

13. The article of claim 1, wherein:
some connectors of the inner sub-array are power connectors; and
the outer rectangular ring comprises:
one or more signal connectors, each configured to carry a signal; and
one or more power connectors.

14. An article of manufacture comprising:
a first interconnection array configured to mate with a corresponding second interconnection array, the first interconnection array comprising:
an inner sub-array of locations having connectors separated by a specified pitch, wherein each connector of the inner sub-array is configured as a power connector;
an outer rectangular ring of locations encircling the inner sub-array of locations and having connectors separated by the specified pitch, wherein:
the outer rectangular ring is separated from the inner sub-array by a depopulated rectangular ring encircling the inner sub-array and having a width of at least the specified pitch, wherein the depopulated rectangular ring has no connectors;
the outer rectangular ring has a plurality of areas devoid of connectors, extending from the depopulated rectangular ring to an outer edge of interconnection array, each area having a width of at least the specified pitch, and disposed relative to the connectors in the outer ring to sub-divide the connectors of the outer ring, in conjunction with the depopulated rectangular range, into a plurality of distinct contiguous sets of connectors.

15. The article of manufacture of claim 14, wherein the first interconnection array is part of a semiconductor device package and the second interconnection array is part of a printed circuit board, and each of the locations of the inner sub-array of locations of the first interconnection array corresponds to a respective via of the printed circuit board.

16. The article of manufacture of claim 14, wherein the respective power connector of each location of the inner sub-array is for one of a power and a ground.

17. A method of assigning connectors in a semiconductor package to specified usages, comprising:
allocating an inner sub-array of connector locations in a first interconnection array, which are separated by a specified pitch, to be a power connector, the inner sub-array of connector locations being at a center of a plane in which the connectors are disposed;
allocating an outer rectangular ring of locations to encircle the inner sub-array of locations, and to have connectors separated by the specified pitch, the outer rectangular ring separated from the inner sub-array by an depopulated rectangular area within the plane that encircles the inner-sub array and is at least as wide as the specified pitch;

maintaining the depopulated rectangular ring to be devoid of connectors; and separating the outer rectangular ring of locations into a plurality of distinct contiguous sets of connectors, each being separated from all of the other distinct sets of connectors and from the inner sub-array by a space devoid of connectors, and being at least as wide as the specified pitch.

\* \* \* \* \*